United States Patent
Tamemoto et al.

(10) Patent No.: US 12,233,481 B2
(45) Date of Patent: Feb. 25, 2025

(54) LASER PROCESSING DEVICE, AND METHOD FOR MANUFACTURING CHIP

(71) Applicants: NICHIA CORPORATION, Anan (JP); HAMAMATSU PHOTONICS K.K., Hamamatsu (JP)

(72) Inventors: Hiroaki Tamemoto, Anan (JP); Minoru Yamamoto, Anan (JP); Yusuke Sekimoto, Hamamatsu (JP); Ryota Sugio, Hamamatsu (JP); Tominori Nakamura, Hamamatsu (JP)

(73) Assignees: NICHIA CORPORATION, Anan (JP); HAMAMATSU PHOTONICS K.K., Hamamatsu (JP)

( * ) Notice: Subject to any disclaimer, the term of this patent is extended or adjusted under 35 U.S.C. 154(b) by 519 days.

(21) Appl. No.: 17/763,379

(22) PCT Filed: Aug. 7, 2020

(86) PCT No.: PCT/JP2020/030465
§ 371 (c)(1),
(2) Date: Mar. 24, 2022

(87) PCT Pub. No.: WO2021/065207
PCT Pub. Date: Apr. 8, 2021

(65) Prior Publication Data
US 2022/0371130 A1    Nov. 24, 2022

(30) Foreign Application Priority Data
Sep. 30, 2019  (JP) .................. 2019-180676

(51) Int. Cl.
*B23K 26/53*   (2014.01)
*B23K 26/046*  (2014.01)
(Continued)

(52) U.S. Cl.
CPC ............ *B23K 26/53* (2015.10); *B23K 26/046* (2013.01); *B23K 26/0622* (2015.10); *H01L 21/78* (2013.01); *B23K 2101/40* (2018.08)

(58) Field of Classification Search
CPC .... B23K 26/53; B23K 26/50; B23K 2103/50; B23K 2103/56; B23K 2103/54; B23K 2103/52; H01L 21/78
See application file for complete search history.

(56) References Cited

FOREIGN PATENT DOCUMENTS

JP    2016-107334 A    6/2016
JP    2018-052814 A    4/2018
(Continued)

OTHER PUBLICATIONS

JP 6715632 English Machine Translation (Year: 2024).*
(Continued)

*Primary Examiner* — Jose R Diaz
(74) *Attorney, Agent, or Firm* — Faegre Drinker Biddle Reath LLP

(57) ABSTRACT

This laser processing apparatus is for forming modified regions in an object, which includes a sapphire substrate having a C-plane as a main surface, along cutting lines by focusing laser light on the object, and is provided with a laser light source, a spatial light modulator, and a focusing optical system. The spatial light modulator performs aberration correction by a first aberration correction amount smaller than an ideal aberration correction amount when the modified region is formed along a first cutting line along an a-axis direction of the sapphire substrate, and performs aberration correction by a second aberration correction amount smaller than the ideal aberration correction amount and different from the first aberration correction amount when the modified region is formed along a second cutting line along an m-axis direction of the sapphire substrate.

13 Claims, 6 Drawing Sheets

(51) Int. Cl.
  *B23K 26/0622* (2014.01)
  *B23K 101/40* (2006.01)
  *H01L 21/78* (2006.01)

(56) References Cited

FOREIGN PATENT DOCUMENTS

| | | |
|---|---|---|
| JP | 2018-120986 A | 8/2018 |
| JP | 2018-134649 A | 8/2018 |
| JP | 2018-142702 A | 9/2018 |
| JP | 2019-020367 A | 2/2019 |
| JP | 2019-050367 A | 3/2019 |
| JP | 6715632 B2 * | 7/2020 |
| TW | 201026418 A | 7/2010 |
| TW | 201210727 A | 3/2012 |
| TW | 201505745 A | 2/2015 |
| TW | 201741058 A | 12/2017 |
| WO | WO-2014156688 A1 * | 10/2014 ......... B23K 26/0648 |

OTHER PUBLICATIONS

WO 2014156688 English Machine Translation (Year: 2024).*
International Preliminary Report on Patentability mailed Apr. 14, 2022 for PCT/JP2020/030465.

* cited by examiner (a)

(b)

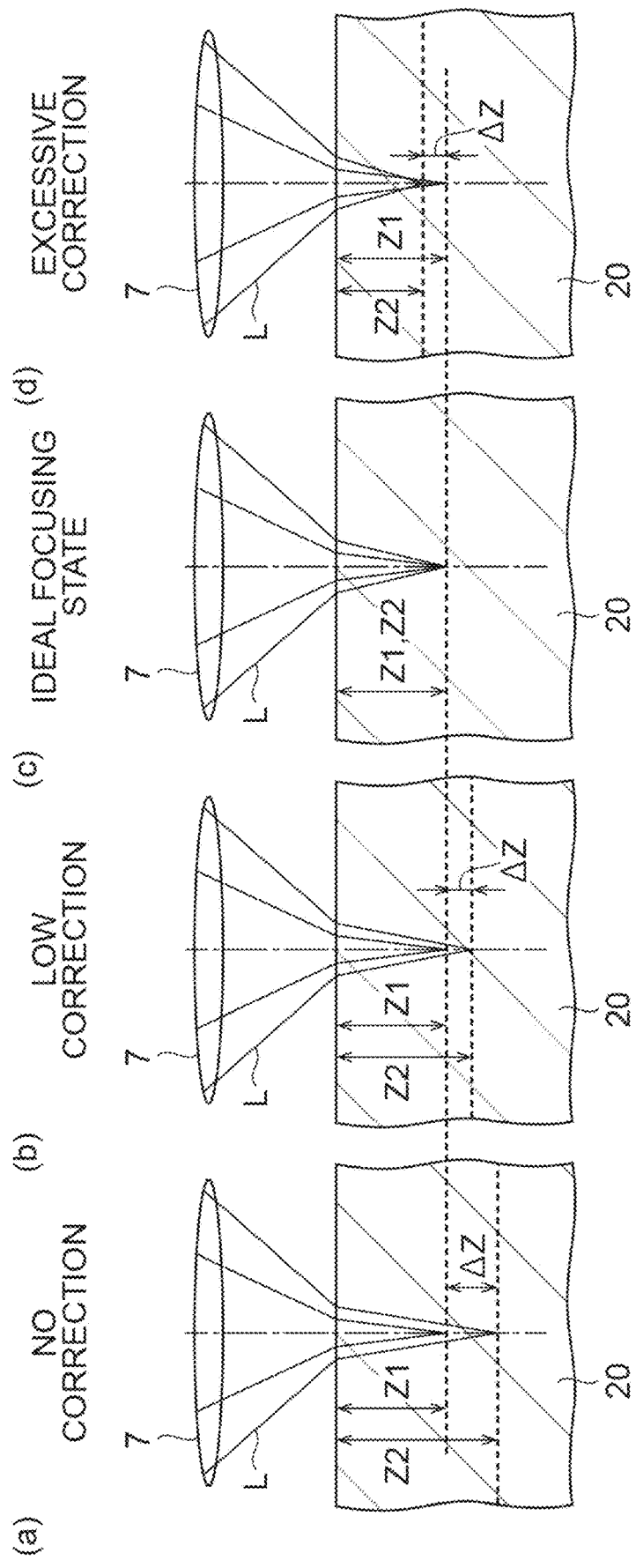

LASER PROCESSING DEVICE, AND METHOD FOR MANUFACTURING CHIP

TECHNICAL FIELD

One aspect of the present invention relates to a laser processing apparatus and a method for manufacturing a chip.

BACKGROUND ART

As a laser processing apparatus, there is known a apparatus that focuses laser light on an object to be processed, while correcting spherical aberration generated at a focusing position due to focusing of laser light on the object (see, for example, Patent Literature 1.).

CITATION LIST

Patent Literature

Patent Literature 1: Japanese Unexamined Patent Publication No. 2016-107334

SUMMARY OF INVENTION

Technical Problem

In the technique as described above, when the pulse energy of the laser light increases, the object is likely to be damaged. Therefore, in recent years, it is expected to achieve laser processing using laser light with small pulse energy.

An object of one aspect of the present invention is to provide a laser processing apparatus and a method for manufacturing a chip with which it is possible to achieve laser processing using laser light with small pulse energy.

Solution to Problem

A laser processing apparatus according to one aspect of the present invention forms modified regions in an object to be processed along cutting lines by focusing laser light on the object, the object including a sapphire substrate having a C-plane as a main surface, the laser processing apparatus including: a laser light source configured to emit the laser light; a spatial light modulator configured to modulate the laser light emitted from the laser light source; and a focusing optical system configured to focus the laser light modulated by the spatial light modulator on the object, wherein, where a state in which aberration correction is performed to counteract spherical aberration generated at a focusing position of the laser light is defined as an ideal focusing state, and an aberration correction amount in the ideal focusing state is defined as an ideal aberration correction amount, the spatial light modulator performs aberration correction by a first aberration correction amount smaller than the ideal aberration correction amount when the modified region is formed along a first cutting line along an a-axis direction of the sapphire substrate, and performs aberration correction by a second aberration correction amount smaller than the ideal aberration correction amount and different from the first aberration correction amount when the modified region is formed along a second cutting line along an m-axis direction of the sapphire substrate.

It is found that, when performing the aberration correction by the first aberration correction amount smaller than the ideal aberration correction amount during the formation of the modified region along the first cutting line along the a-axis direction of the sapphire substrate, the extensibility of a crack in the thickness direction of the sapphire substrate is improved as compared with a case in which the aberration correction is performed using the ideal aberration correction amount, and thus, the object can be cut along the first cutting line even with small pulse energy. In addition, it is found that, when performing the aberration correction by the second aberration correction amount smaller than the ideal aberration correction amount and different from the first aberration correction amount during the formation of the modified region along the second cutting line along the m-axis direction of the sapphire substrate, the extensibility of a crack in the thickness direction of the sapphire substrate is improved as compared with a case in which the aberration correction is performed using the ideal aberration correction amount, and thus, the object can be cut along the second cutting line even with small pulse energy. Therefore, according to one aspect of the present invention, it is possible to achieve laser processing using laser light with small pulse energy.

In the laser processing apparatus according to one aspect of the present invention, the first aberration correction amount may be smaller than the second aberration correction amount. In this case, the extensibility of the crack in the thickness direction of the sapphire substrate is further improved, and thus, the object can be cut even with smaller pulse energy.

In the laser processing apparatus according to one aspect of the present invention, the first cutting line may be perpendicular to an orientation flat of the object when the object is viewed in the thickness direction. This makes it possible to achieve laser processing using laser light with small pulse energy with the orientation flat of the object being used as a reference.

In the laser processing apparatus according to one aspect of the present invention, the second cutting line may be parallel to the orientation flat of the object when the object is viewed in the thickness direction. This makes it possible to achieve laser processing using laser light with small pulse energy with the orientation flat of the object being used as a reference.

In the laser processing apparatus according to one aspect of the present invention, the object may include a device layer provided on a front surface side of the object, and a back surface of the object may be used as an incidence surface where the laser light enters. In this case, since laser processing using laser light with small pulse energy can be achieved as described above, it is possible to reduce an increase in damage (so-called damage due to escaping light) to the device layer by laser light passing through the sapphire substrate.

A method for manufacturing a chip according to one aspect of the present invention includes: a step of preparing an object to be processed including a sapphire substrate having a C-plane as a main surface; and a step of forming a modified region on the sapphire substrate by modulating laser light emitted from a laser light source by a spatial light modulator and by focusing the laser light modulated by the spatial light modulator on the sapphire substrate by a focusing optical system, wherein, the step of modulating the laser light by the spatial light modulator includes, provided that a state in which aberration correction is performed to counteract spherical aberration generated at a focusing position of the laser light is defined as an ideal focusing state, and an aberration correction amount in the ideal focusing state is defined as an ideal aberration correction amount, performing aberration correction by a first aberration correction amount smaller than the ideal aberration correction amount when the modified region is formed along a first cutting line along an a-axis direction of the sapphire substrate, and performing aberration correction by a second aberration correction amount smaller than the ideal aberration correction amount and different from the first aberration correction amount when the modified region is formed along a second cutting line along an m-axis direction of the sapphire substrate.

In the method for manufacturing a chip according to one aspect of the present invention, the first aberration correction amount may be smaller than the second aberration correction amount.

In the method for manufacturing a chip according to one aspect of the present invention, the first cutting line may be perpendicular to an orientation flat of the object when the object is viewed in the thickness direction.

In the method for manufacturing a chip according to one aspect of the present invention, the second cutting line may be parallel to the orientation flat of the object when the object is viewed in the thickness direction.

In the method for manufacturing a chip according to one aspect of the present invention, the object may include a device layer provided on a front surface side of the object, and a back surface of the object may be used as an incidence surface where the laser light enters.

In the method for manufacturing a chip according to one aspect of the present invention, when the modified region is formed along the first cutting line, the laser light may have pulse energy within a range of 9.0 µJ or more and 12.0 µJ or less, and the first aberration correction amount may fall within a range of 25% or more and 75% or less of the ideal aberration correction amount. In this case, the chip can be manufactured with good yield.

In the method for manufacturing a chip according to one aspect of the present invention, when the modified region is formed along the first cutting line, the laser light may have pulse energy within a range of 8.5 µJ or more and 12.0 µJ or less, and the first aberration correction amount may fall within a range of 50% or more and 62.5% or less of the ideal aberration correction amount. In this case, the chip can be manufactured with good yield.

In the method for manufacturing a chip according to one aspect of the present invention, when the modified region is formed along the second cutting line, the laser light may have pulse energy within a range of 8.0 µJ or more and 12.0 µJ or less, and the second aberration correction amount may fall within a range of 75% or more and less than 100% of the ideal aberration correction amount. In this case, the chip can be manufactured with good yield.

Advantageous Effects of Invention

According to one aspect of the present invention, it is possible to provide a laser processing apparatus and a method for manufacturing a chip with which it is possible to achieve laser processing using laser light with small pulse energy.

BRIEF DESCRIPTION OF DRAWINGS

FIG. 6(a) is a diagram for describing a focusing state without aberration correction. FIG. 6(b) is a diagram for describing a focusing state having low correction attributed to an aberration correction amount smaller than an ideal aberration correction amount. FIG. 6(c) is a diagram for describing an ideal focusing state. FIG. 6(d) is a diagram for describing a focusing state having excessive correction attributed to the aberration correction amount greater than the ideal aberration correction amount.

DESCRIPTION OF EMBODIMENTS

Figure 1:
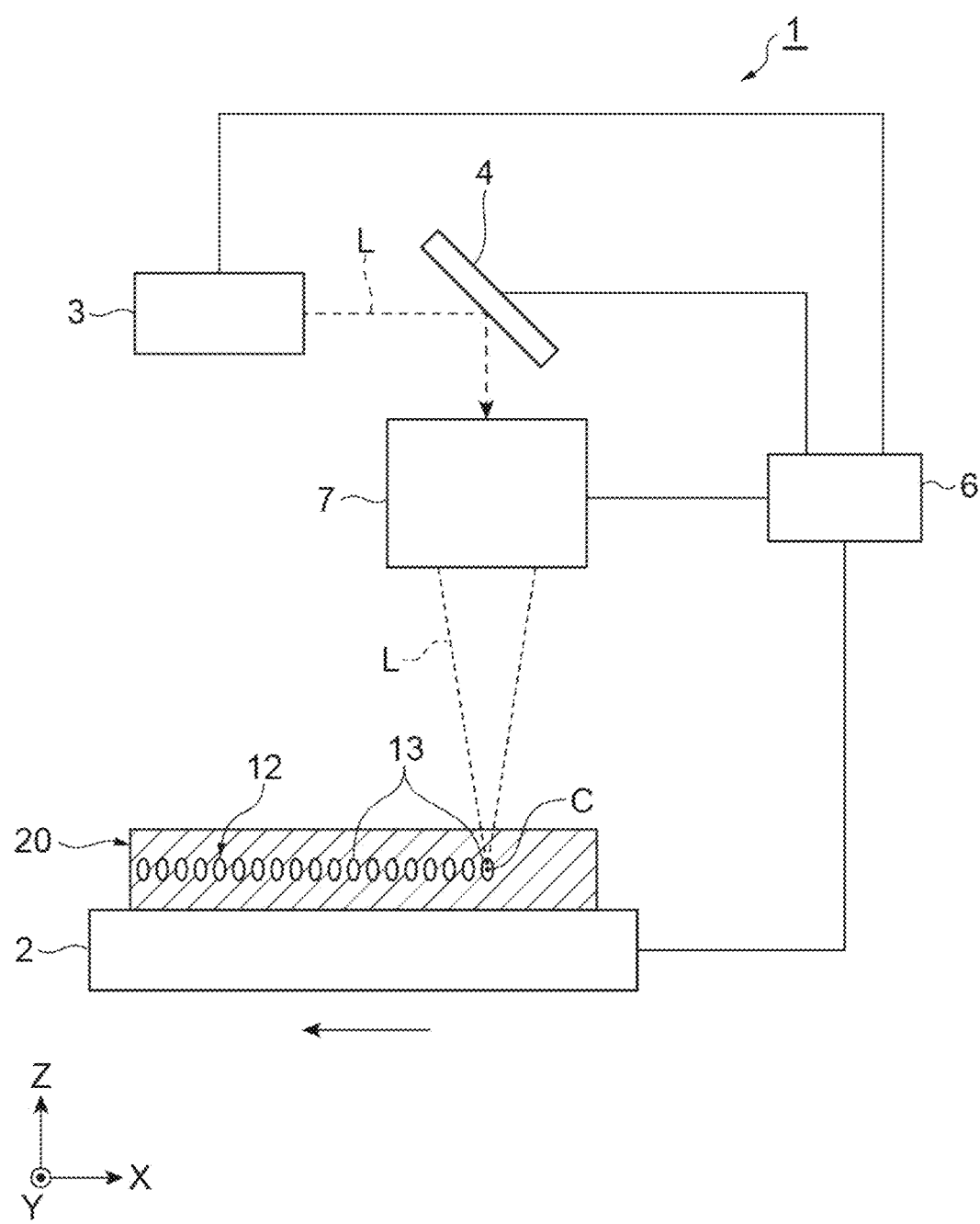
FIG. 1 is a configuration diagram of a laser processing apparatus according to an embodiment.

An embodiment will now be described in detail with reference to the drawings. In the drawings, the same or corresponding parts are denoted by the same reference numerals, and redundant description will be omitted.

[Configuration of Laser Processing Apparatus]

As illustrated in FIG. 1, a laser processing apparatus 1 includes a stage 2, a laser light source 3, a spatial light modulator 4, a focusing lens (focusing optical system) 7, and a controller 6. The laser processing apparatus 1 forms modified regions 12 in an object to be processed 20 along cutting lines by irradiating the object 20 with laser light L. Hereinafter, a first horizontal direction is referred to as an X direction, and a second horizontal direction perpendicular to the first horizontal direction is referred to as a Y direction. The vertical direction is referred to as a Z direction.

The stage 2 supports the object 20, for example, by sucking a film attached to the object 20. In the present embodiment, the stage 2 is movable along each of the X direction and the Y direction. Further, the stage 2 is rotatable about an axis along the Z direction. The laser light source 3 emits the laser light L transmittable through the object 20 in, for example, a pulse oscillation. The spatial light modulator 4 modulates the laser light L output from the laser light source 3. The spatial light modulator 4 is, for example, a spatial light modulator (SLM) of a reflective liquid crystal on silicon (LCOS). The focusing lens 7 focuses the laser light L modulated by the spatial light modulator 4 on the object 20.

When the laser light L is focused inside the object 20 supported by the stage 2, the laser light L is particularly absorbed in a portion corresponding to a focusing point C of the laser light L, so that the modified region 12 is formed inside the object 20. The modified region 12 indicates a region that differs from the surrounding unmodified regions in density, refractive index, mechanical strength, and other physical properties. Examples of the modified region 12 include a melting treatment region, a crack region, a dielectric breakdown region, and a refractive index changed region.

As an example, when the stage 2 is moved along the X direction while the object 20 is irradiated with the laser light L, and the focusing point C is relatively moved along the X direction with respect to the object 20, a plurality of modified spots 13 is formed so as to be arranged in a row along the X direction. A single modified spot 13 is formed by irradiation of the laser light L having a single pulse. A single row of modified regions 12 is a set of a plurality of modified spots 13 arranged in a single row. The adjacent modified spots 13 may be connected to each other or may be separated from each other depending on the relative movement speed of the focusing point C with respect to the object 20 and the repetition frequency of the laser light L.

A controller 6 controls the stage 2, the laser light source 3, the spatial light modulator 4, and the focusing lens 7. The controller 6 is configured as a computer device including a processor, a memory, a storage, a communication device, and the like. In the controller 6, software (program) read into the memory or the like is executed by the processor, and the processor controls reading/writing of data in the memory and the storage and communication by the communication device. As a result, the controller 6 performs various functions.

Figure 2:
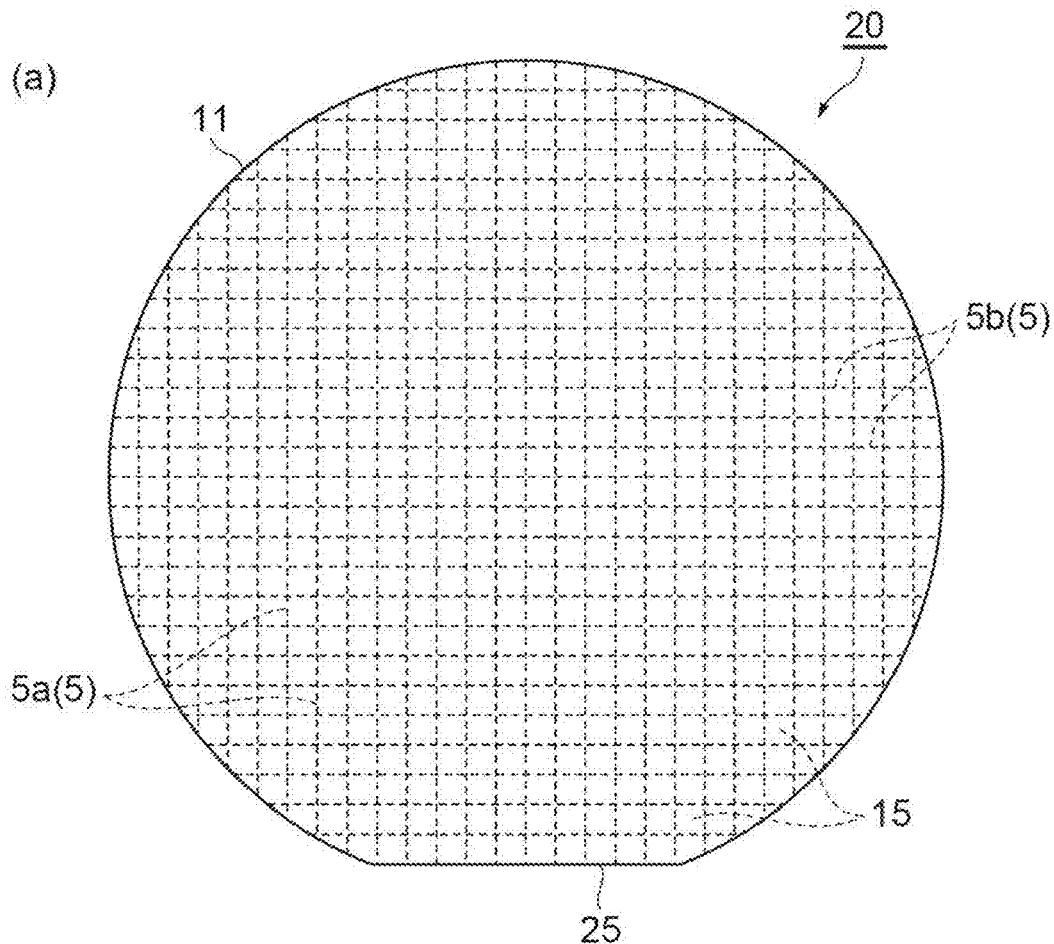
FIG. 2(a) is a plan view of an object to be processed.
FIG. 2(b) is a side sectional view of a part of the object.
Figure 2:
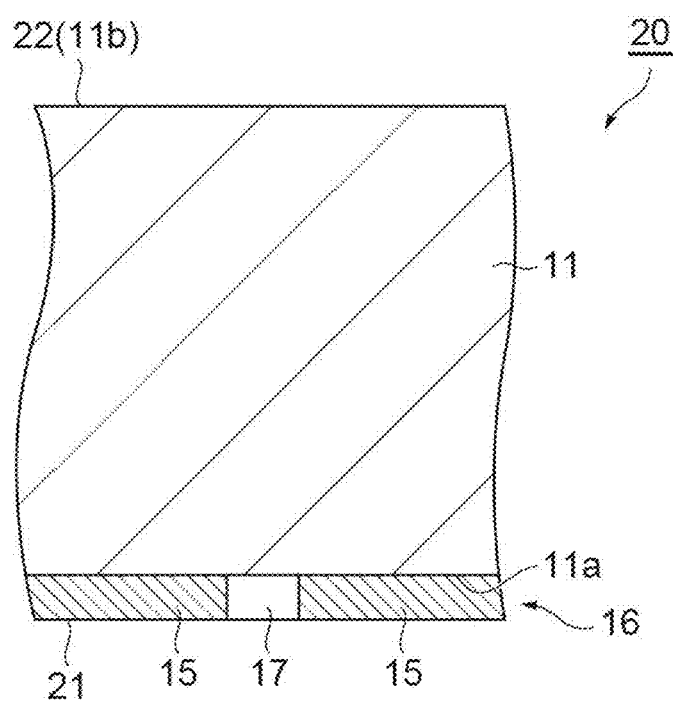

As illustrated in FIGS. 2(a) and 2(b), the object 20 includes a sapphire substrate 11 having a C-plane as main surfaces (a front surface 11a and a back surface 11b), and a plurality of functional elements 15 formed on the front surface 11a (one main surface) of the sapphire substrate 11. The object 20 has a disk shape. An orientation flat 25 is formed on the object 20. The orientation flat 25 is a flat surface formed on a part of the outer peripheral surface of the object 20. The orientation flat 25 constitutes a part of the side surface of the object 20.

The sapphire substrate 11 is a disk-shaped (plate-shaped) substrate formed of sapphire which is a hexagonal material. The C-plane is a (0001) plane. Each of the functional elements 15 is a light receiving element such as a photodiode, a light emitting element such as a laser diode or a light emitting diode, a circuit element formed as a circuit, or the like. The plurality of functional elements 15 is arranged in a matrix on the front surface 11a of the sapphire substrate 11. Thus the object 20 has a device layer 16 that is provided on the front surface 21 side thereof and that includes the plurality of functional elements 15. The object 20 and the sapphire substrate 11 can have any appropriate shape.

A laser processing method performed in the laser processing apparatus 1 is used as a chip manufacturing method for manufacturing a plurality of chips by cutting the object 20 for each functional element 15. To this end, in the laser processing apparatus 1, a plurality of cutting lines 5 is set in a matrix in the object 20 so as to pass through street regions 17 between the adjacent functional elements 15 (so as to pass through the inside of the street regions 17 in the width direction when viewed in the thickness direction (Z direction) of the object 20). In a case of splitting the object 20 along the a-axis having cleavage, laser irradiation may be performed with the irradiation position of the laser light L intentionally shifted (offset) in consideration of an amount of oblique cleavage (cleavage amount). With such an offset, it is possible to prevent a crack of the sapphire substrate 11 from protruding from the street region 17 and reaching the inside of a region to be the functional element 15. Then, the laser light L entered through the back surface 22 of the object 20, which is also the back surface 11b of the sapphire substrate 11, is focused, and the modified region 12 is formed in the object 20 along each cutting line 5. The back surface 22 constitutes an incidence surface where the laser light L enters. The cutting line 5 is a virtual line, but may be an actually drawn line. The cutting line 5 may be specified by coordinates.

The spatial light modulator 4 has a liquid crystal layer (display unit) on which the laser light L is incident. When forming the modified region 12, the spatial light modulator 4 performs aberration correction by displaying a predetermined modulation pattern on the liquid crystal layer and modulating the laser light L. The modulation pattern to be displayed is derived and stored in advance, for example, on the basis of at least one of a depth position (position in the Z direction) at which the modified region 12 is to be formed, a wavelength of the laser light L, a material of the object 20, refractive indexes of the focusing lens 7 and the object 20, etc. An operation of the spatial light modulator 4 such as the operation of displaying the modulation pattern is controlled by the controller 6.

The modulation pattern includes a spherical aberration correction pattern that reduces spherical aberration. The spherical aberration is a phenomenon in which light rays constituting the laser light L varies (blurs) without converging to one point. The spherical aberration elongates the focusing region of the laser light L (the region where the light beams constituting the laser light L are focused) in the Z direction. Note that the modulation pattern may include at least one of a pattern for branching a processing point, an individual difference correction pattern for correcting an individual difference generated in the laser processing apparatus 1, and the like, in addition to the spherical aberration correction pattern.

When forming the modified regions 12 along first cutting lines 5a of the plurality of cutting lines 5, the spatial light modulator 4 performs aberration correction by a first aberration correction amount smaller than an ideal aberration correction amount in an ideal focusing state. When forming the modified regions 12 along second cutting lines 5b of the plurality of cutting lines 5, the spatial light modulator 4 performs aberration correction by a second aberration correction amount that is smaller than the ideal aberration correction amount in the ideal focusing state and that is different from the first aberration correction amount.

The ideal focusing state indicates a state in which aberration is corrected so as to counteract the spherical aberration generated at the focusing position of the laser light L, and indicates a focusing state in which the aberration is reduced to obtain a state closer to a focusing state assumed to have no medium. The ideal aberration correction amount indicates an aberration correction amount that provides the ideal focusing state in a medium. The focusing position of the laser light L can be specified by common technical knowledge. For example, the focusing position of the laser light L corresponds to the position of the focusing point C in FIG. 1. For example, the focusing position of the laser light L corresponds to a position near the center of the focusing region of the laser light L.

Each of the first cutting lines 5a is a line along the a-axis direction of the sapphire substrate 11. The first cutting line 5a is perpendicular to the orientation flat 25 of the object 20 when viewed in the Z direction. Each of the second cutting lines 5b is a line along the m-axis direction of the sapphire substrate 11. The second cutting lines 5b are parallel to the orientation flat 25 of the object 20 when viewed in the Z direction. The first aberration correction amount is smaller than the second aberration correction amount. The m-axis is perpendicular to the m-plane. The a-axis is perpendicular to the a-plane.

Figure 3:
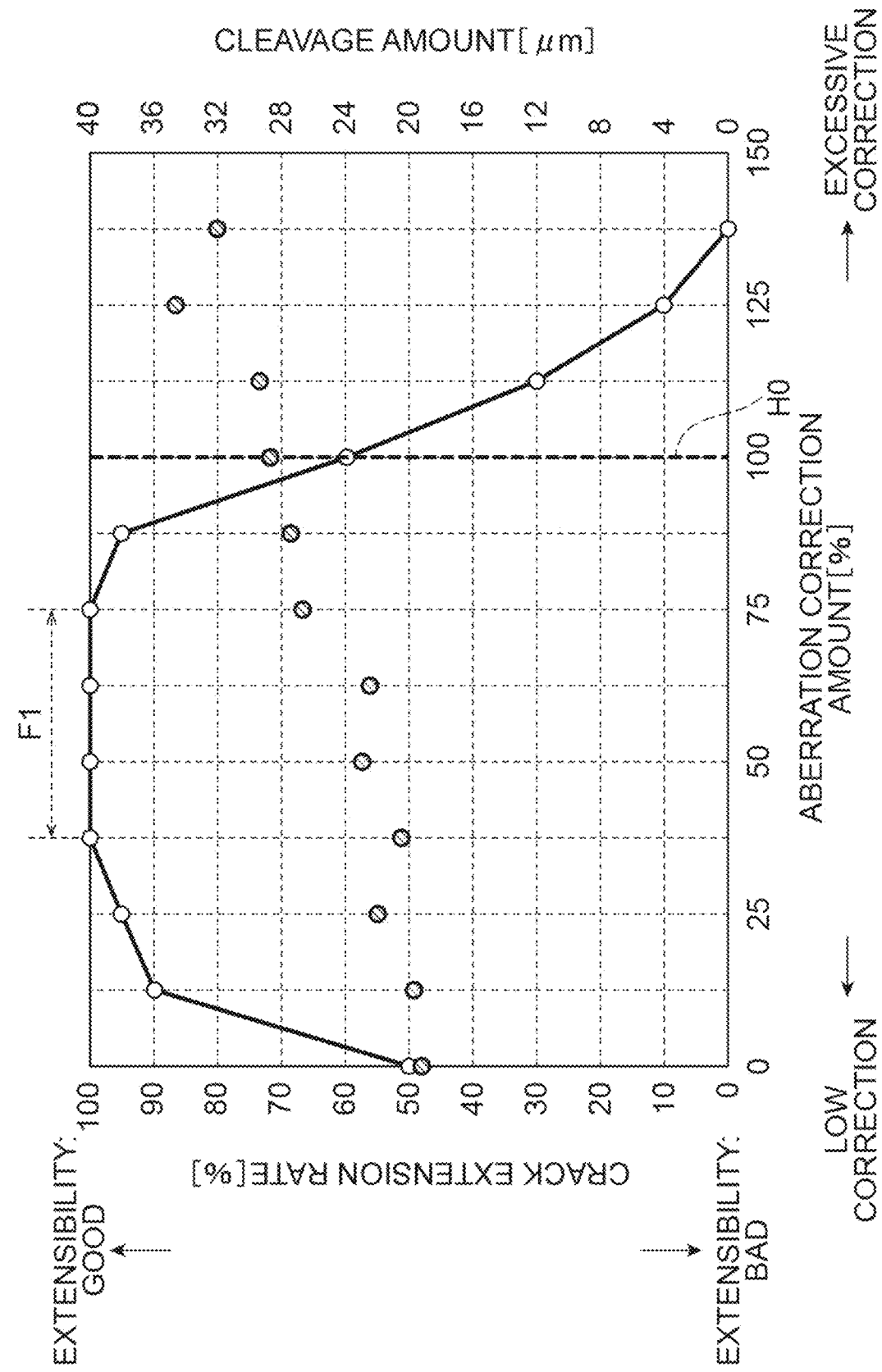
FIG. 3 is a graph illustrating an evaluation result of laser processing along a first cutting line perpendicular to an orientation flat.

FIG. 3 is a graph illustrating an evaluation result of laser processing along the first cutting line 5a perpendicular to the orientation flat 25. The processing conditions are set such that the wavelength of the laser light L is 1030 nm, the pulse width is 6 ps, the pulse energy is 9.5 µJ, the defocus is 40 µm, the scanning rate is 400 mm/s, and the repetition frequency is 50 kHz. Under these condition, the pulse pitch calculated from the scanning rate and the repetition frequency is 8 µm.

The back surface 22 is an incidence surface where the laser light L enters. The ideal aberration correction amount in this case is set to H0. The scanning rate is a relative rate of the laser light L scanned along the cutting line 5. The defocus indicates, in terms of distance, how close an objective lens is to an object medium incidence surface based on a distance when laser light is focused most on the front surface of the object medium incidence surface at a processing laser focusing point (the same applies hereinafter).

The processing conditions for the first cutting line 5a along the a-axis direction may be set such that the pulse width is 0.1 ps to 10 ps, the pulse energy is 8.5 µJ to 12 µJ, and the defocus amount is 32 µm to 50 µm. The pulse pitch determined from the repetition frequency and the scanning rate may be 5 µm to 10 µm.

The horizontal axis represents the aberration correction amount. In the aberration correction amount in this graph, the ideal aberration correction amount H0 is set to 100%, and an amount in the case where the aberration correction is not performed is set to 0% (the same applies hereinafter). Any appropriate expression (unit) of the aberration correction amount can be employed. When the aberration correction amount is larger than the ideal aberration correction amount H0, the correction is determined to be excessive. When the aberration correction amount is smaller than the ideal aberration correction amount H0, the correction is determined to be low. The vertical axes include the axis of crack extension rate. For example, when laser processing is performed on a predetermined region (for example, the entire region) of the object 20 when viewed in the Z direction, the "crack extension rate" is represented by "a region where it can be evaluated that a crack from the modified region 12 sufficiently extends"/"a predetermined region subjected to laser processing" (see the following). Whether or not the crack from the modified region 12 sufficiently extends can be evaluated by various evaluation methods. For example, when the crack extending from the modified region 12 reaches both the front surface 11a and the back surface 11b of the sapphire substrate 11, it can be evaluated that the crack from the modified region 12 sufficiently extends. The closer to 100% the crack extension rate is, the better the extension of the crack from the modified region 12 in the Z direction is. The closer to 0% the crack extension rate is, the worse the extension of the crack from the modified region 12 in the Z direction is. The crack extension rate can also be visually checked. The polygonal line in the graph indicates the crack extension rate. In addition, the vertical axes include an axis of a cleavage amount. The cleavage amount is a length along the m-axis direction of a crack extending from the modified region 12 formed by laser processing along the a-axis direction.

Crack extension rate=region where it can be evaluated that the crack from the modified region 12 extends sufficiently as viewed in the Z direction/predetermined region of the object 20 subjected to laser processing as viewed in the Z direction FIG. 6(a) is a diagram for describing a focusing state without aberration correction. FIG. 6(b) is a diagram for describing a focusing state having low correction attributed to the aberration correction amount smaller than the ideal aberration correction amount. FIG. 6(c) is a diagram for describing the ideal focusing state. FIG. 6(d) is a diagram for describing a focusing state having excessive correction in which the aberration correction amount is greater than the ideal aberration correction amount. FIGS. 6(a) to 6(d) correspond to side sectional views of the object 20 when the object 20 made of sapphire is irradiated with the laser light L in the air.

As illustrated in FIG. 6(a), in the focusing state without aberration correction, a distance Z2 from the front surface of the object 20 to a focusing point of an outside light beam of the laser light L is larger than a distance Z1 from the front surface of the object 20 to a focusing point of an inside light beam of the laser light L, for example. In this case, a difference ΔZ occurs between the distances Z1 and Z2. As illustrated in FIG. 6(b), in the focusing state where the correction is low, the distance Z2 is still larger than the distance Z1, for example, and thus, the difference ΔZ occurs between the distances Z1 and Z2. As illustrated in FIG. 6(c), in the ideal focusing state, the distances Z1 and Z2 are equal to each other, for example, and thus, the difference ΔZ does not occur between the distances Z1 and Z2. As illustrated in FIG. 6(d), in the focusing state where the correction is excessive, the distance Z2 is smaller than the distance Z1, for example, and thus, the difference ΔZ occurs between the distances Z1 and Z2.

As illustrated in FIG. 3, the following knowledge is found when the modified region 12 is formed along the first cutting line 5a. That is, the crack extension rate can be increased by setting the aberration correction amount to be smaller than the ideal aberration correction amount (by shifting the aberration correction amount to the low correction side). The crack extension rate tends to be improved in a range F1 where the aberration correction amount is 37.5% or more and less than 75%. In the range F1, the cleavage amount is in the range of about 20 to about 30 µm. The range F1 is wider than a range F2 in FIG. 4. The range F1 is located on the low correction side with respect to the range F2 in FIG. 4. When the aberration correction amount is larger than the ideal aberration correction amount (correction is excessive), the crack extension rate is extremely deteriorated. When the aberration correction amount is larger than the ideal aberration correction amount, the crack may meander and the cleavage amount of the crack may increase.

The range of the pulse energy during the laser processing for the first cutting line 5a along the a-axis direction may be set so that the crack extension rate is 50% or more in order to improve the yield when the object 20 is cut into chips. If the pulse energy is set too high, the functional element 15 may be damaged, leading to deterioration of characteristics. In addition, if the pulse energy is set too high, the modified region 12 increases in size, so that the modified regions 12 affect each other, which may rather deteriorate crack extensibility. Therefore, during the processing for the first cutting line 5a along the a-axis direction, the pulse energy may be set in the abovementioned range of 8.5 µJ or more and 12.0 µJ or less. When the pulse energy is set in the range of 8.5 µJ or more and 12.0 µJ or less, it is possible to achieve good crack extension with a crack extension rate of 50% or more and to reduce damage to the functional element 15.

Figure 4:
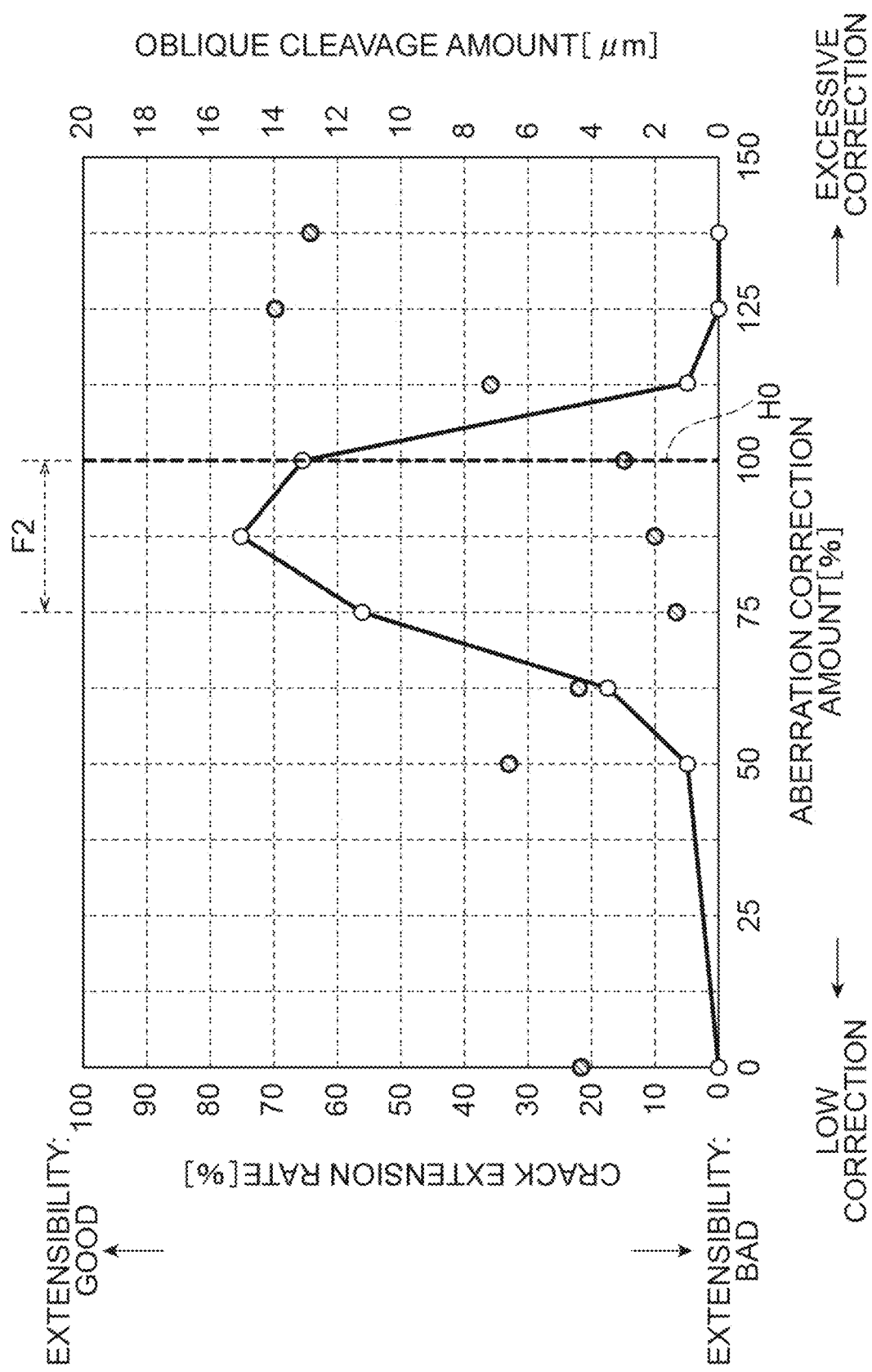
FIG. 4 is a graph illustrating an evaluation result of laser processing along a second cutting line parallel to the orientation flat.

FIG. 4 is a graph illustrating an evaluation result of laser processing along the second cutting line 5b parallel to the orientation flat 25. The processing conditions are set such that the wavelength of the laser light L is 1030 nm, the pulse width is 6 ps, the pulse energy is 8.0 µJ, the scanning rate is 400 m/s, and the defocus is 40 µm. The back surface 22 is an incidence surface where the laser light L enters. The ideal aberration correction amount in this case is set to H0. The horizontal axis represents the aberration correction amount. The vertical axes include the axis of a crack extension rate and the axis of an oblique cleavage amount. The polygonal line in the graph indicates the crack extension rate. The oblique cleavage amount is a length along the a-axis direction of a crack extending from the modified region 12 formed by laser processing along the m-axis direction. The oblique cleavage amount is likely to be smaller than the cleavage amount due to the characteristics of the sapphire substrate 11. Therefore, the crack along the m-axis direction is more likely to extend than the crack along the a-axis direction. The pulse energy of the laser processing along the m-axis direction may be set so that the oblique cleavage amount is 3.0 μm or less in order to easily set the cutting position within the street region 17.

The processing conditions for the second cutting line 5b along the m-axis direction may be set such that the pulse width is 0.1 ps to 10 ps, the pulse energy is 8.0 μJ to 12 μJ, and the defocus amount is 30 μm to 50 μm. The pulse pitch determined by the repetition frequency and the scanning rate may be 5 μm to 10 μm.

The range of the pulse energy during the laser processing for the second cutting line 5b along the m-axis direction may be set so that the crack extension rate is 50% or more in order to improve the yield when the object 20 is cut into chips. If the pulse energy is set too high, the functional element 15 may be damaged, leading to deterioration of characteristics. In addition, if the pulse energy is set too high, the modified region 12 increases in size, so that the modified regions 12 affect each other, which may rather deteriorate crack extensibility. Therefore, during the processing for the second cutting line 5b along the m-axis direction, the pulse energy may be set in the abovementioned range of 8.0 μJ or more and 12.0 μJ or less. When the pulse energy is set in the range of 8.0 μJ to 12.0 μJ, it is possible to achieve good crack extension with a crack extension rate of 50% or more and to suppress damage to the functional element 15. Here, the crack in the m-axis direction is likely to extend with lower pulse energy as compared with the crack in the a-axis direction. Therefore, the pulse energy in the processing for the second cutting line 5b along the m-axis direction can be set within a range of 8.0 μJ or more and 12.0 μJ or less, which is wider than the range (8.5 μJ or more and 12.0 μJ or less) of the pulse energy in the laser processing along the a-axis direction. Furthermore, when the pulse energy during the processing for the second cutting line 5b along the m-axis direction is within the range of 8.0 μJ or more and 12.0 μJ or less, the oblique cleavage amount is 3.0 μm or less, so that the cutting position easily falls within the street region 17.

As illustrated in FIG. 4, the following knowledge is found when the modified region 12 is formed along the second cutting line 5b. That is, the crack extension rate can be increased by setting the aberration correction amount to be smaller than the ideal aberration correction amount (by shifting the aberration correction amount to the low correction side). The crack extension rate tends to be improved in the range F2 where the aberration correction amount is 75% or more and less than 100. It is likely that, when the aberration correction amount is 87.5%, the crack extension rate has a local maximum point. Setting the aberration correction amount to be smaller than the ideal aberration correction amount does not have a great effect on the oblique cleavage amount.

Figure 5:
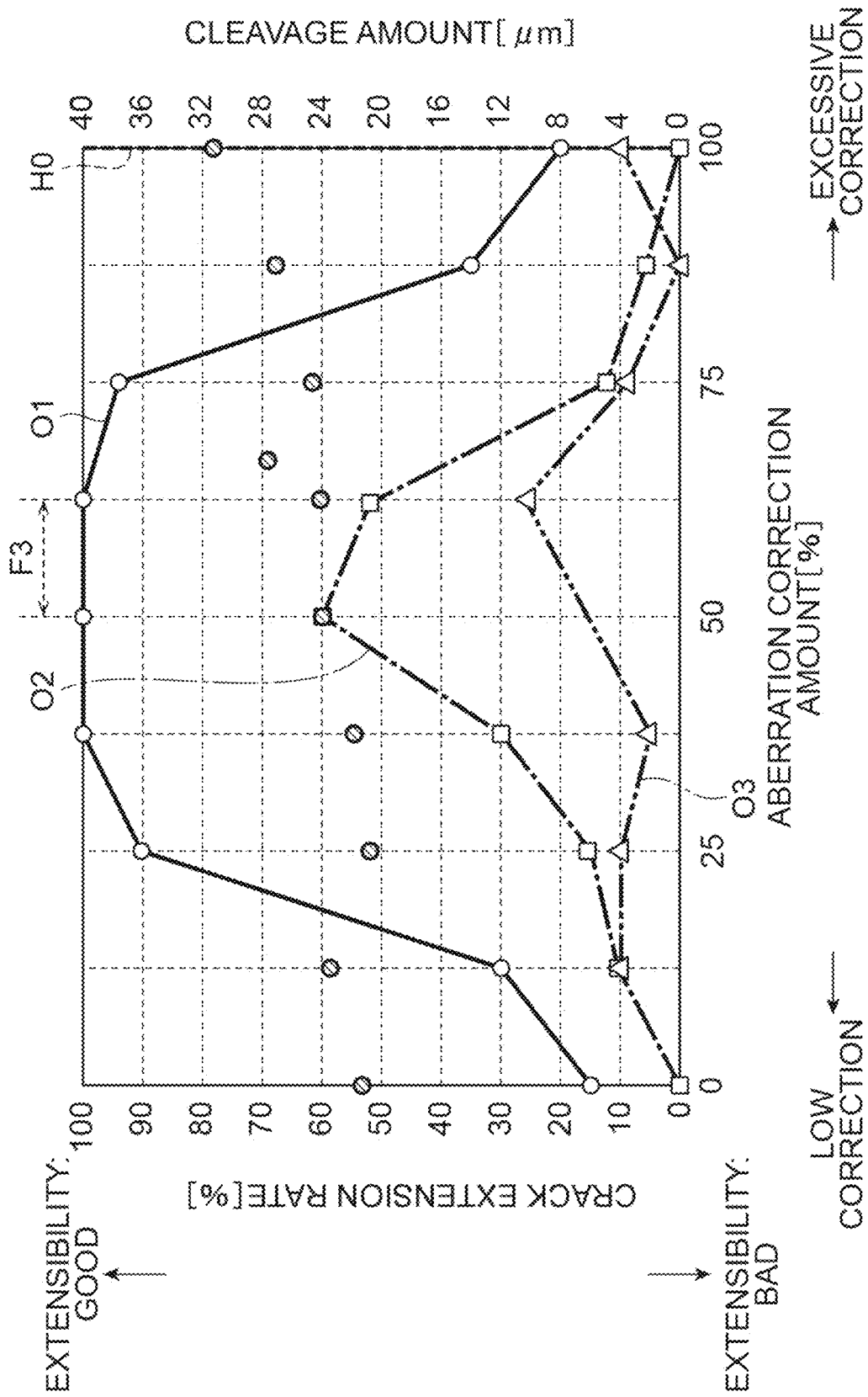
FIG. 5 is a graph illustrating an evaluation result of laser processing along the first cutting line perpendicular to the orientation flat.

FIG. 5 is a graph illustrating an evaluation result of laser processing along the first cutting line 5a perpendicular to the orientation flat 25. The processing conditions of the evaluation result of FIG. 5 are set such that the pulse energy of the laser light L is 9.0 μJ, 8.5 μJ and 8.0 μJ which are lower than the pulse energy in the processing conditions of the evaluation result of FIG. 3. The polygonal line in the graph indicates the crack extension rate. O1 in the graph indicates a result of the crack extension rate when the pulse energy is set to 9.0 μJ, O2 in the graph indicates a result of the crack extension rate when the pulse energy is set to 8.5 μJ, and O3 in the graph indicates a result of the crack extension rate when the pulse energy is set to 8.0 μJ.

As illustrated in FIG. 5, the following knowledge is further found when the modified region 12 is formed along the first cutting line 5a. That is, when the pulse energy of the laser light L is reduced, the local maximum point of the crack extension rate becomes noticeable. When the pulse energy of the laser light L is reduced, the crack extension rate has a local maximum point in a range F3 where the aberration correction amount is 50% or more and less than 62.5%. The range F3 is located on the low correction side with respect to the range F2 in FIG. 4. The range F3 is narrower than the range F1 in FIG. 3.

The method for manufacturing a chip according to the present embodiment is a method in which the object 20 is cut to obtain a chip, and is performed using the laser processing apparatus 1 described above. That is, the method for manufacturing a chip according to the present embodiment includes: a step of preparing the object 20; and a step of forming the modified region 12 on the sapphire substrate 11 including modulating the laser light L emitted from the laser light source 3 by the spatial light modulator 4 and focusing the laser light L modulated by the spatial light modulator 4 on the sapphire substrate 11 by the focusing lens 7. In the modulation of the laser light L by the spatial light modulator 4, aberration correction is performed by the first aberration correction amount smaller than the ideal aberration correction amount when the modified region 12 is formed along the first cutting line 5a, and the aberration correction is performed by the second aberration correction amount smaller than the ideal aberration correction amount and different from the first aberration correction amount when the modified region 12 is formed along the second cutting line 5b.

Here, in view of the knowledge that the local maximum point of the crack extension rate becomes prominent when the pulse energy of the laser light L is decreased, it is thought that, increase in the pulse energy of the laser light L causes an increase of the range of the first aberration correction amount in which the crack extension rate has the local maximum point. Therefore, it is thought that an increase in the pulse energy of the laser light L also causes an increase of the range of the first aberration correction amount with the crack extension rate of 50% or more. That is, the result illustrated in FIG. 5, indicating that the crack extension rate is 50% or more when the first aberration correction amount is at least within a range of 25% or more and 75% or less of the ideal aberration correction amount in the case where the laser light L has the pulse energy of 9.0 μJ, is considered to be applicable to the case where the pulse energy of the laser light L is 9.0 μJ or more. However, as described above, when the pulse energy is too high, such pulse energy adversely affects the crack extensibility, and from this viewpoint, the upper limit of the pulse energy of the laser light L may be 12.0 μJ. That is, when the modified region 12 is formed along the first cutting line 5a along the a-axis direction, setting the pulse energy of the laser light L to be in the range of 9.0 μJ or more and 12.0 μJ or less and setting the first aberration correction amount to be in the range of 25% or more and 75% or less of the ideal aberration correction amount allows for achieving good crack extension with a crack extension rate of 50% or more.

In addition, the result illustrated in FIG. 5, indicating that the crack extension rate is 50% or more when the first aberration correction amount is 50% or more and 62.5% or less in the case where the pulse energy of the laser light L is 8.5 µJ, is considered to be applicable to the case where the pulse energy of the laser light L is 8.5 µJ or more. However, as described above, the upper limit of the pulse energy of the laser light L may be 12.0 µJ. That is, when the modified region 12 is formed along the first cutting line 5a along the a-axis direction, setting the pulse energy of the laser light L to be in the range of 8.5 µJ or more and 12.0 µJ or less and setting the first aberration correction amount to be in the range of 50% or more and 62.5% or less of the ideal aberration correction amount allows for achieving good crack extension with a crack extension rate of 50% or more.

In addition, the result illustrated in FIG. 4, indicating that the crack extension rate is 50% or more when the second aberration correction amount is in the range of 75% or more and 100% or less in the case where the pulse energy of the laser light L is 8.0 µJ, is considered to be applicable to the case where the pulse energy of the laser light L is 8.0 µJ or more. However, as described above, the upper limit of the pulse energy of the laser light L may be 12.0 µJ. That is, when the modified region 12 is formed along the second cutting line 5b along the m-axis direction, setting the pulse energy of the laser light L to be in the range of 8.0 µJ or more and 12.0 µJ or less and setting the second aberration correction amount to be in the range of 75% or more and 100% or less of the ideal aberration correction amount allows for achieving good crack extension with a crack extension rate of 50% or more.

As described above, it is found that, when the modified region 12 is formed along the first cutting line 5a along the a-axis direction of the sapphire substrate 11 by laser processing, the extensibility of the crack in the Z direction is improved by performing the aberration correction by the first aberration correction amount smaller than the ideal aberration correction amount as illustrated in FIGS. 3, 4, and 5, as compared with the case in which the aberration correction is performed using the ideal aberration correction amount. In this manner, it is found that the object 20 can be cut along the first cutting line even with small pulse energy. In addition, it is found that, when the modified region 12 is formed along the second cutting line 5b along the m-axis direction of the sapphire substrate 11, the extensibility of the crack in the Z direction is improved by performing the aberration correction using the second aberration correction amount smaller than the ideal aberration correction amount and different from the first aberration correction amount, as compared with the case in which the aberration correction is performed by the ideal aberration correction amount. In this manner, it is found that the object 20 can be cut along the second cutting line even with small pulse energy.

In this regard, in the laser processing apparatus 1 and the method for manufacturing a chip, the aberration correction is performed by the first aberration correction amount when the modified region 12 is formed along the first cutting line 5a, and the aberration correction is performed by the second aberration correction amount when the modified region 12 is formed along the second cutting line 5b. Therefore, the extensibility of the crack can be improved, and laser processing using the laser light L with small pulse energy can be achieved. As a result, damage to the object 20 can be reduced. Even when the object 20 has a great thickness, it is possible the object 20 with high accuracy while reducing an increase in pulse energy and reducing damage.

In the laser processing apparatus 1 and the method for manufacturing a chip, the first aberration correction amount is smaller than the second aberration correction amount. In this case, as described in the above knowledge, it is possible to further improve the extensibility of the crack and cut the object 20 even with smaller pulse energy. When a plurality of rows of modified regions 12 are formed in the thickness direction of the sapphire substrate 11 for each of the first cutting lines 5a along the a-axis direction of the sapphire substrate 11 and each of the second cutting lines 5b along the m-axis direction of the sapphire substrate 11, all the first aberration correction amounts in the thickness direction of the sapphire substrate 11 may be smaller than all the second aberration correction amounts in the thickness direction of the sapphire substrate 11. That is, all the first aberration correction amounts at the time of forming the plurality of rows of modified regions 12 along the first cutting lines 5a may be smaller than all the second aberration correction amounts at the time of forming the plurality of rows of modified regions 12 along the second cutting lines 5b.

In the laser processing apparatus 1 and the method for manufacturing a chip, the first cutting lines 5a are perpendicular to the orientation flat 25 when viewed in the Z direction. This makes it possible to achieve laser processing using laser light with low pulse energy with the orientation flat 25 being used as a reference.

In the laser processing apparatus 1 and the method for manufacturing a chip, the second cutting lines 5b are parallel to the orientation flat 25 when viewed in the Z direction. This makes it possible to achieve laser processing using laser light with low pulse energy with the orientation flat 25 being used as a reference.

In the laser processing apparatus 1 and the method for manufacturing a chip, the device layer 16 is provided on the front surface 21 side of the object 20, and the back surface 22 of the object is used as an incidence surface where the laser light L enters. In this structure, since laser processing using the laser light L with small pulse energy can be achieved as described above, and thus it is possible to reduce an increase in damage (so-called damage due to escaping light) to the device layer 16 by the laser light L passing through the sapphire substrate 11.

In the method for manufacturing a chip, when the modified region 12 is formed along the first cutting line 5a, the pulse energy of the laser light L is in the range of 9.0 µJ or more and 12.0 µJ or less, and the first aberration correction amount is in the range of 25% or more and 75% or less of the ideal aberration correction amount. In this manner, it is possible to obtain a crack extension rate of 50% or more and to manufacture the chip (to dice the object 20) with a good yield.

In the method for manufacturing a chip, when the modified region 12 is formed along the first cutting line 5a, the pulse energy of the laser light L may be in the range of 8.5 µJ or more and 12.0 µJ or less, and the first aberration correction amount may be in the range of 50% or more and 62.5% or less of the ideal aberration correction amount. In this case, it is possible to obtain a crack extension rate of 50% or more, so that the chips can be manufactured with a good yield.

In the method for manufacturing a chip, when the modified region 12 is formed along the second cutting line 5b, the pulse energy of the laser light L may be in the range of 8.0 µJ or more and 12.0 µJ or less, and the second aberration correction amount may be in the range of 75% or more and less than 100% of the ideal aberration correction amount. In this case, it is possible to obtain a crack extension rate of 50% or more and to manufacture the chip with a good yield. In addition, the oblique cleavage amount can be set to 3 µm or less.

While the embodiment has been described above, one aspect of the present invention is not limited to the embodiment described above.

In one aspect of the present invention, the laser light L is relatively moved with respect to the object 20 by moving the stage 2, but instead of or in addition to this move, the laser light L may be relatively moved with respect to the object 20 by moving the focusing lens 7. In one aspect of the present invention, the back surface 22 of the object 20 is used as the incidence surface where the laser light L enters, but the front surface 21 of the object 20 may be used as the incidence surface where the laser light L enters. In one aspect of the present invention, expressions "being along the a-axis direction and the m-axis direction", "being parallel", and "being perpendicular" may include deviations, and can indicate being substantially along the a-axis direction and the m-axis direction, being substantially parallel, and being substantially perpendicular.

One aspect of the present invention can be acknowledged as a laser processing apparatus, a laser processing method, an apparatus for manufacturing a semiconductor member, or a method for manufacturing a semiconductor member. Each of the configurations in the embodiment and modifications mentioned above is not limited to have the materials and shapes described above, and various materials and shapes can be applied thereto. Furthermore, the configurations in the embodiment or modifications described above can be applied, as appropriate, to configurations in another embodiment or modifications.

REFERENCE SIGNS LIST

1 Laser processing apparatus
3 Laser light source
4 Spatial light modulator
5 Cutting line
5a First cutting line
5b Second cutting line
7 Focusing lens (focusing optical system)
11 Sapphire substrate
11a Front surface (main surface)
11b Back surface (main surface)
12 Modified region
16 Device layer
20 Object to be processed
22 Back surface
25 Orientation flat
L Laser light

The invention claimed is:

1. A laser processing apparatus configured to form modified regions in an object to be processed along cutting lines by focusing laser light on the object, the object including a sapphire substrate having a C-plane as a main surface, the laser processing apparatus comprising:
 a laser light source configured to emit the laser light;
 a spatial light modulator configured to modulate the laser light emitted from the laser light source; and
 a focusing optical system configured to focus the laser light modulated by the spatial light modulator on the object, wherein,
 provided that a state in which aberration correction is performed to counteract spherical aberration generated at a focusing position of the laser light is defined as an ideal focusing state, and that an aberration correction amount in the ideal focusing state is defined as an ideal aberration correction amount,
 the spatial light modulator performs aberration correction by a first aberration correction amount smaller than the ideal aberration correction amount when the modified region is formed along a first cutting line along an a-axis direction of the sapphire substrate, and
 the spatial light modulator performs aberration correction by a second aberration correction amount smaller than the ideal aberration correction amount and different from the first aberration correction amount when the modified region is formed along a second cutting line along an m-axis direction of the sapphire substrate.

2. The laser processing apparatus according to claim 1, wherein the first aberration correction amount is smaller than the second aberration correction amount.

3. The laser processing apparatus according to claim 1, wherein the first cutting line is perpendicular to an orientation flat of the object when the object is viewed in a thickness direction.

4. The laser processing apparatus according to claim 1, wherein the second cutting line is parallel to an orientation flat of the object when the object is viewed in a thickness direction.

5. The laser processing apparatus according to claim 1, wherein
 the object has a device layer provided on a front surface side of the object, and
 a back surface of the object is used as an incidence surface where the laser light enters.

6. A method for manufacturing a chip, the method comprising:
 a step of preparing an object to be processed including a sapphire substrate having a C-plane as a main surface; and
 a step of forming a modified region on the sapphire substrate comprising:
 modulating laser light emitted from a laser light source by a spatial light modulator and
 focusing the laser light modulated by the spatial light modulator on the sapphire substrate by a focusing optical system, wherein,
 in the step of modulating the laser light by the spatial light modulator,
 provided that a state in which aberration correction is performed to counteract spherical aberration generated at a focusing position of the laser light is defined as an ideal focusing state, and that an aberration correction amount in the ideal focusing state is defined as an ideal aberration correction amount,
 aberration correction is performed by a first aberration correction amount smaller than the ideal aberration correction amount, when the modified region is formed along a first cutting line along an a-axis direction of the sapphire substrate, and
 aberration correction is performed by a second aberration correction amount smaller than the ideal aberration correction amount and different from the first aberration correction amount, when the modified region is formed along a second cutting line along an m-axis direction of the sapphire substrate.

7. The method for manufacturing a chip according to claim 6, wherein the first aberration correction amount is smaller than the second aberration correction amount.

8. The method for manufacturing a chip according to claim 6, wherein the first cutting line is perpendicular to an orientation flat of the object when the object is viewed in a thickness direction.

9. The method for manufacturing a chip according to claim 6, wherein the second cutting line is parallel to an orientation flat of the object when the object is viewed in a thickness direction.

10. The method for manufacturing a chip according to claim 6, wherein
the object has a device layer provided on a front surface side of the object, and
a back surface of the object is used as an incidence surface where the laser light enters.

11. The method for manufacturing a chip according to claim 6, wherein, when the modified region is formed along the first cutting line, the laser light has pulse energy within a range of 9.0 μJ or more and 12.0 μJ or less, and the first aberration correction amount falls within a range of 25% or more and 75% or less of the ideal aberration correction amount.

12. The method for manufacturing a chip according to claim 6, wherein, when the modified region is formed along the first cutting line, the laser light has pulse energy within a range of 8.5 μJ or more and 12.0 μJ or less, and the first aberration correction amount falls within a range of 50% or more and 62.5% or less of the ideal aberration correction amount.

13. The method for manufacturing a chip according to claim 6, wherein, when the modified region is formed along the second cutting line, the laser light has pulse energy within a range of 8.0 μJ or more and 12.0 μJ or less, and the second aberration correction amount falls within a range of 75% or more and less than 100% of the ideal aberration correction amount.

* * * * *